(12) United States Patent
Terasawa et al.

(10) Patent No.: US 7,755,942 B2
(45) Date of Patent: Jul. 13, 2010

(54) MEMORY CELL ARRAY AND SEMICONDUCTOR MEMORY

(75) Inventors: Tomonori Terasawa, Tokyo (JP); Nobukazu Murata, Tokyo (JP)

(73) Assignee: Oki Semiconductor Co., Ltd., Tokyo (JP)

( * ) Notice: Subject to any disclaimer, the term of this patent is extended or adjusted under 35 U.S.C. 154(b) by 99 days.

(21) Appl. No.: 12/073,968

(22) Filed: Mar. 12, 2008

(65) Prior Publication Data
US 2008/0291725 A1 Nov. 27, 2008

(30) Foreign Application Priority Data
May 21, 2007 (JP) ............................. 2007-134023
Aug. 14, 2007 (JP) ............................. 2007-211331

(51) Int. Cl.
*G11C 16/24* (2006.01)
(52) U.S. Cl. ............................. 365/185.05; 365/185.11; 365/185.13
(58) Field of Classification Search ............ 365/185.05, 365/185.11, 185.13
See application file for complete search history.

(56) References Cited
U.S. PATENT DOCUMENTS
6,633,496 B2 10/2003 Maayan et al.
2007/0183211 A1* 8/2007 Yano et al. ............. 365/185.23

* cited by examiner

*Primary Examiner*—Hoai V Ho
*Assistant Examiner*—Jay Radke
(74) *Attorney, Agent, or Firm*—Rabin & Berdo, P.C.

(57) ABSTRACT

A memory cell array includes a plurality of memory cells disposed in matrix. A plurality of word lines extend in the row direction, and the gates in the memory cells disposed in each row are commonly connected to one of the word lines. A plurality of sub bit lines extend in the column direction, and the sources in the memory cells disposed in a first column and the drains in the memory cells disposed in a second column, which is adjacent to the first column, are commonly connected to one of the sub bit lines. A plurality of pairs of transistors are provided, each having a source selector and a drain selector. Each transistor pair is disposed at one of the locations at both ends of the sub bit lines, which are adjacent to each other, in a manner such that the transistor pairs sandwich the word lines from alternating sub bit ends.

9 Claims, 4 Drawing Sheets

MEMORY CELL ARRAY AND SEMICONDUCTOR MEMORY

CROSS-REFERENCE TO RELATED APPLICATION

This application claims the priority benefit of Japanese Patent Application No. 2007-134023 filed on May 21, 2007 and Japanese Patent Application No. 2007-211331, filed Aug. 14, 2007, the entire disclosures of which are incorporated herein by reference.

BACKGROUND OF THE INVENTION

1. Field of the Invention

The invention relates to a memory cell array having a plurality of electrically-rewritable memory cells, and a semiconductor memory having such a memory cell array.

2. Description of the Related Art

A memory cell array having a plurality of electrically-rewritable memory cells is well-known. The conventional memory cell array includes a plurality of word lines, a plurality of bit lines, which are perpendicular to the word lines and a plurality of memory cells, each of which is disposed at one of the intersections between the word lines and the bit lines so that the memory cells are disposed in matrix. Each memory cell includes a transistor and a capacitor, and the operation of reading out from a memory cell and the operation of writing data in a memory cell are performed by charging or discharging a capacitor. In case of a flash memory, each memory cell includes a transistor having a floating gate for storing electric charges. Thus, the operation of reading out from a memory cell and the operation of writing data in a memory cell are performed by the existence of the electric charge at the floating gate. In either case, in order to readout information from a certain memory cell, the voltage is applied to the word line, which is connected to the memory cell so that the information stored in the memory cell is outputted to the bit line. According to the conventional memory cell array, the length of the route that the electric current flows in the bit line depends on the location of the memory cell being accessed (the location of the word line to which the voltage is applied). The longer the length of the bit line in which the electric current flows is, the higher the resistance value of the bit line is. Thus, at the end of the bit lines to which a sense amplifier is connected, the electric current value varies, depending on the location of the memory cell. To avoid the variation of the electric current value, an architecture of the memory cells such that the length of the route that the electric current flows in any bit line becomes the same is disclosed in the following Reference.

Reference: U.S. Pat. No. 6,633,496 B1

However, according to the architecture of the memory cell disclosed in the Reference, a single metal bit line is set at either a source electric potential of a memory cell being accessed or a drain electric potential of a memory cell being accessed. Compared with architecture of the memory cell in which a single metal bit line is set at one of the source and a drain electric potentials of a memory cell being accessed, the power consumption at the time of charging or discharging at the metal bit line becomes larger, and the time for charging or discharging at the metal bit line becomes longer.

SUMMARY OF THE INVENTION

An objective of the invention is to solve the above-described problem and to provide a memory cell array, which suppresses the variation of the electric current value at the location where the bit lines end, not depending on the location of the memory cell being accessed, while the power consumption and the time required for the charge or the discharge are suppressed to low and short.

The objective is achieved by a memory cell array including a plurality of memory cells disposed in columns and in rows, each memory cell including a transistor having a gate, a source and a drain; a plurality of word lines extending in the row direction, wherein the gates of transistors in the memory cells disposed in each row are commonly connected to one of the word lines; a plurality of sub bit lines extending to the column direction, wherein the sources of the transistors in the memory cells disposed in a first column and the drains of the transistors in the memory cells disposed in a second column, which is adjacent to the first column, are commonly connected to one of the sub bit lines; and a plurality of pairs of transistors, each pair having a source selector and a drain selector, wherein each pair is disposed at one of the locations at both ends of the sub bit lines, which are adjacent to each other, in a manner such that the transistor pairs sandwich the word lines from alternating sub bit ends.

BRIEF DESCRIPTION OF THE DRAWINGS

The invention will be more particularly described with reference to the accompanying drawings, in which.

DETAILED DESCRIPTION OF THE PREFERRED EMBODIMENTS

The preferred embodiment of the invention as to a memory cell array is explained together with drawings as follows. In each drawing, the same reference numbers designate the same or similar components through all embodiments.

The Preferred Embodiment

Figure 1:
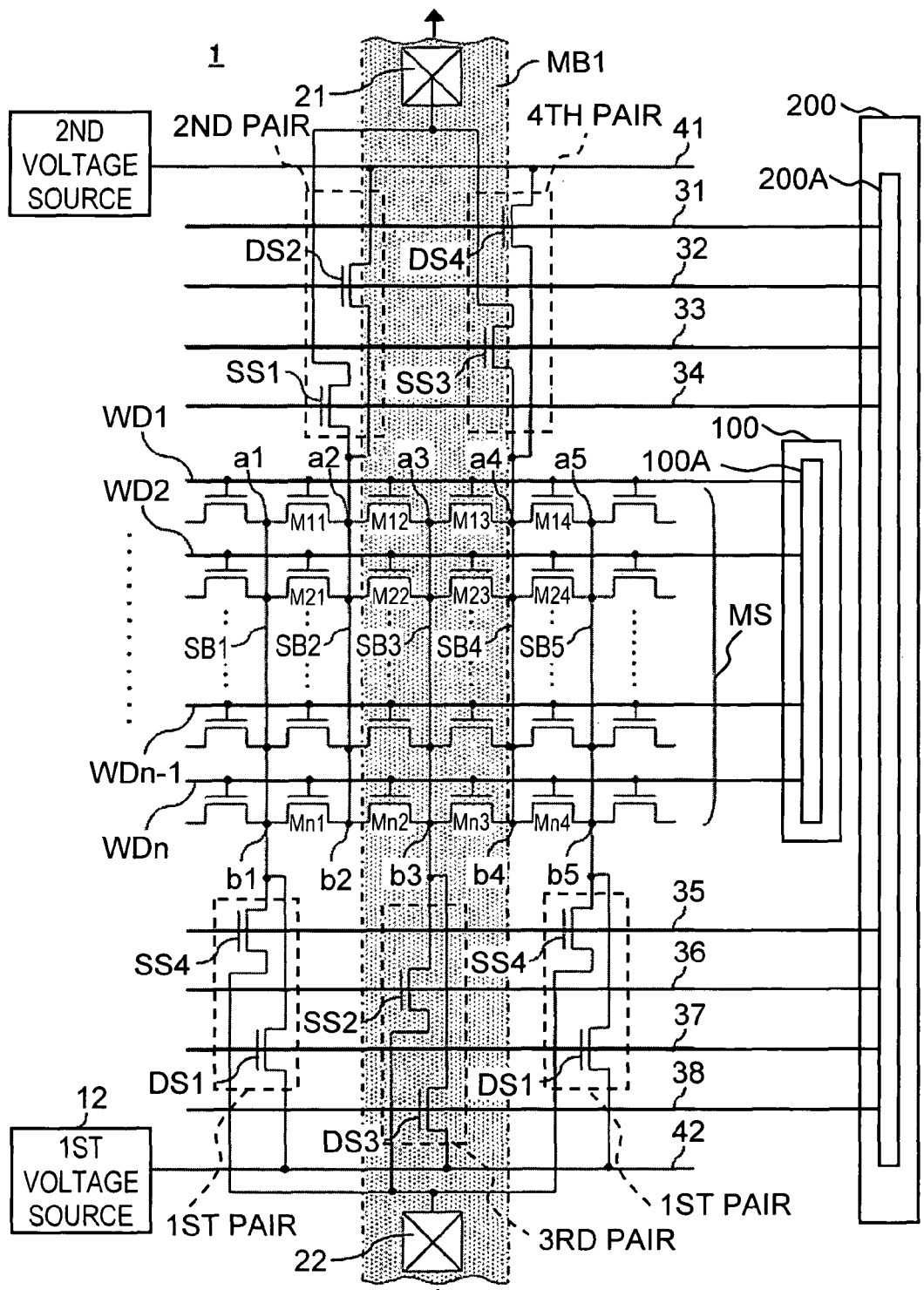
FIG. 1 is a circuit diagram of a memory cell array, according to a preferred embodiment.

FIG. 1 is a circuit diagram of a memory cell array 1, according to a preferred embodiment. A semiconductor memory, such as a flash memory, includes the memory cell array 1. The memory cell array 1 includes a memory cell group MS. The memory cell group MS includes a plurality of memory cells, which are disposed in rows and in columns (namely in matrix). In the first row of the memory cell group MS, the memory cells M11, M12, M13 and M14 are arranged, and in the first column, the memory cells M11, M21 . . . Mn1 (n=integral number) are arranged. Since the flash memory is used in the preferred embodiment, each memory cell includes a transistor having a floating gate for storing electric charges. Thus, the operation of reading out from a memory cell and the operation of writing data in a memory cell are performed by the existence of the electric charge at the floating gate. The memory cells M11~Mn4 . . . may be replaced by memory cells, each of which includes the combination of a transistor and a capacitor. If such memory cells are used in the memory cell array 1, the operation of reading out from a memory cell and the operation of writing data in a memory cell are performed by charging or discharging a capacitor.

Each of word lines WD1~WDn (n=integral number) is commonly connected to the gates of the memory cells disposed in a row. For example, the word line WL1 is commonly connected to the gates of the memory cells M11, M12, M13 and M14 . . . disposed in the first row.

Each of sub bit lines SB1~SB5 is commonly connected to the sources or the drains of the memory cells disposed in a column. For example, the sub bit line SB1 is commonly connected to the sources or the drains of the memory cells M11, M21 . . . Mn1 disposed in the first column.

A pair of transistors (called simply a "pair" hereafter) having a drain selector and a source selector is disposed at one end of each sub bit line SB1~SB5. For more detail on this matter, the transistor pairs are disposed at location which sandwiches the word lines WD1~WDn. Furthermore, the transistor pairs in FIG. 1 are disposed at opposite ends of sub bit lines in an alternating manner, as shown. For example, the sub bit line SB3 and the sub bit line SB2 are located next to each other. A third pair including the drain selector DS3 and the source selector SS2 is connected to one end b3 of the sub bit line SB3, and a second pair including the drain selector DS2 and the source selector SS1 is connected to one end a2 of the sub bit line SB2. Each of the third and the second pairs is disposed at one of the sides sandwiching the word lines WD1~WDn.

The drain selectors DS1 and DS3 are connected to a first power supply line 42, which is connected to a first constant-voltage source 12. The first constant-voltage source 12 is connected to the sub bit lines SB1 and SB5 via the drain selectors DS1, and to the sub bit lines SB3 via the drain selector DS3. The first constant-voltage source 12 provides a constant voltage to the drain of each of the memory cells, each of which is connected to one of the sub bit lines SB1, SB3 and SB5. On the other side, the drain selectors DS2 and DS4 are connected to a second power supply line 41, which is connected to a second constant-voltage source 11. The second constant-voltage source 11 is connected to the sub bit lines SB2 via the drain selectors DS2, and to the sub bit lines SB4 via the drain selector DS4. The second constant-voltage source 11 provides a constant voltage to the drain of each of the memory cells, each of which is connected to one of the sub bit lines SB2 and SB4.

The sub bit lines SB1, SB2, SB3, SB4 and SB5 are connected to a main bit line MB1, which is illustrated by a broken line, via the source selectors SS4, SS1, SS2, SS3 and SS4, respectively. The main bit line MB1, which is strip-shaped, is formed of conductive material, and its wire width is wider than that of each sub bit line SB1, SB2, SB3, SB4 or SB5. In the preferred embodiment, the main bit line MB1 is formed at a certain layer, which is different from the layer where the sub bit lines SB1, SB2, SB3, SB4 and SB5 are formed so that the sub bit lines SB1, SB3 and SB 5 are connected to the main bit line MB1 via a first via-hole 22 and the sub bit lines SB2, and SB 4 are connected to the main bit line MB1 via a second via-hole 21. The main bit line MB 1 is not ended near the first and the second via-holes 22, 21, and it elongates in the upper and lower directions more than illustrated.

The flash memory of the invention further includes a word line selecting circuit 100 for selecting one of the word lines WD1~WDn. The word line selector supplies a voltage to one of the word lines WD1~WDn via a word line selector 100A formed in the word line selecting circuit 100, which is connected to the word lines WD1~WDn so that one of the word lines WD1~WDn is selected. As a result, a plurality of memory cells disposed in the row, which are connected to the selected word line, are selected. For example, when the voltage is applied to the word line WD1 by the word line selector 100A, then the memory cells M11, M12, M13 and M14, which are commonly connected to the word line WD1, are selected.

The flash memory of the invention further includes a memory cell readout circuit 200, which readouts the information stored in one of the memory cells being connected to the selected word lines by selecting one of the drain selectors DS1~DS4 and by selecting one of the source selectors SS1~SS4. Since each of the drain selectors DS1~DS4 and the source selectors SS1~SS4 are formed by a transistor, one of the drain selectors DS1~DS4 and one of the source selectors SS1~SS4 can be selected by applying the voltage to the gates of them via a selector 200A formed in the memory cell readout circuit 200. The selector 200A connected to selection lines 31~38, and the voltage is applied to the gate of one of the drain selectors DS1~DS4 and the gate of one of the source selectors SS1~SS4 via two of the selection lines 31~38 selected by the selector 200A. For example, when the voltage is supplied on the select lines 34 and 37 by the memory cell readout circuit 200, the voltage is applied to the gates of the drain selector DS1 and the source selector SS1. Thus, the drain selector DS1 and the source selector SS1 are selected.

The following table 1 shows a selection patterns for the drain selector DS1~DS4 and the source selectors SS1~SS4.

TABLE 1

| Selection pattern | Drain selector | Source selector |
| --- | --- | --- |
| 1A | DS1 | SS1 |
| 1B | DS2 | SS4 |
| 2A | DS2 | SS2 |
| 2B | DS3 | SS1 |
| 3A | DS3 | SS3 |
| 3B | DS4 | SS2 |
| 4A | DS4 | SS4 |
| 4B | DS1 | SS3 |

In the "Selection patterns" of the table 1, symbols 1A~4B indicating the selection patterns are indicated. There are eight (8) selection patterns in the preferred embodiment. When the selection pattern 1A or 1B is selected, one of the memory cells M11, M21 . . . Mn1 disposed in the first column is selected. One of the memory cells M11, M21 . . . . Mn1 is selected by applying the voltage to one of the word lines WD1~WDn. As well, when the selection pattern 2A or 2B is selected, one of the memory cells M12, M22 . . . Mn2 disposed in the second column is selected. When the selection pattern 3A or 3B is selected, one of the memory cells M13, M23 . . . Mn3 disposed in the third column is selected. Finally, when the selection pattern 4A or 4B is selected, one of the memory cells M14, M24 . . . Mn4 disposed in the fourth column is selected. In the table, "Drain selector" and "Source selector" mean one of the drain selectors and one of the source selectors being selected simultaneously in each selection pattern.

For example, when the selection pattern 1A is selected, the memory cell readout circuit 200 selects the drain selector DS1 and the source selector SS1 are selected simultaneously. Under this condition, when the voltage is applied to the word line WL1, one side of the memory cell M11, which is connected to the sub bit line SB1, is considered as its drain, and the other side of the memory cell M11, which is connected to the sub bit line SB2, is considered as its source. Thus, the electric current flows from the left side to the right side in the memory cell M11.

On the other hand, when the selection pattern 1B is selected, the memory cell readout circuit 200 selects the drain selector DS2 and the source selector SS4 are selected simultaneously. Under this condition, when the voltage is applied to the word line WL1, one side of the memory cell M11, which is connected to the sub bit line SB2, is considered as its drain, and the other side of the memory cell M11, which is connected to the sub bit line SB1, is considered as its source. Thus, the electric current flows from the right side to the left side in the memory cell M11. Accordingly, when the selection pattern shown in the table 1 includes the symbol "A" at its end, the electric current flows from the left side to the right side in the selected memory cell. On the other hands, when the selection pattern shown in the table 1 includes the symbol "B" at its end, the electric current flows from the right side to the left side in the selected memory cell.

It is clear from the table 1 and FIG. 1 that the memory cell readout circuit 200 selects the drain selector DS1 and the source selector SS1, which is located other side of the lord lines WD1~WDn, simultaneously. For example, when the selection pattern 3A is selected, the memory cell readout circuit 200 selects the drain selector DS3 and the source selector SS3 simultaneously wherein each of the drain selector DS3 and the source selector SS3 is disposed at one of the sides sandwiching the word lines WD1~WDn. In any other selection patterns, each of the drain selector and the source selector SS3 being selected simultaneously is disposed at one of the sides sandwiching the word lines WD1~WDn.

Figure 2:
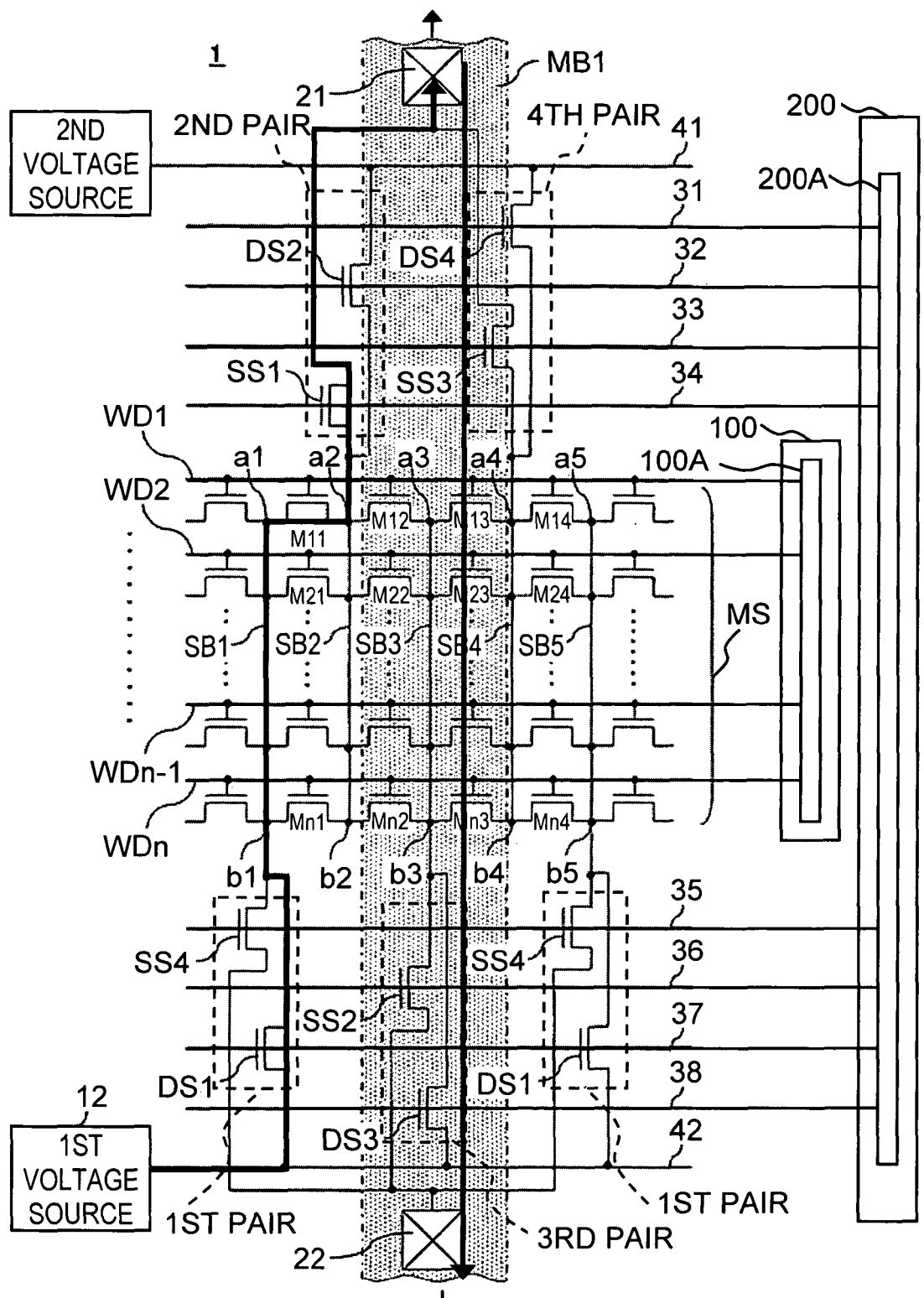
FIG. 2 shows a route of electric current in the memory cell array shown in FIG. 1 when a certain memory cell is selected.

FIG. 2 shows a route of electric current in the memory cell array 1 shown in FIG. 1 when the memory cell M11 is selected by selecting the word line WD1 under the selection of the selection pattern 1A. The route of the electric current is illustrated with a bold arrow, and the direction of the current flow is indicated by the bold arrow.

In FIG. 2, since the memory cell readout circuit 200 selects the drain selector DS1, the electric current flows from its drain to its source in the drain selector DS1. As a result, the electric current flows from the first constant-voltage source 12 to the sub bit line SB1. Since the word line selecting circuit 100 selects the word line WD1, the electric current flows in the memory cell M11 whose gate is connected to the word line WD1, from its drain to its source. On the other hand, since the memory cell readout circuit 200 also selects the source selector SS1, the electric current flows from its drain to its source in the source selector SS1. As a result, the electric current flows from the source of the memory cell M11 to the second via-hole 21. The electric current flows on the main bit line MB1 via the second via-hole 21. The sense amplifier is connected to the main bit line MB1 at its end so that the electric current on the main bit line MB1 in the direction from the second via-hole 21 and to the first via-hole 22 (in the direction toward the location where the sense amplifier is disposed). The information stored in the memory cell M11 is provided to the sense amplifier by the memory cell readout circuit 200 through the electric current route.

Figure 3:
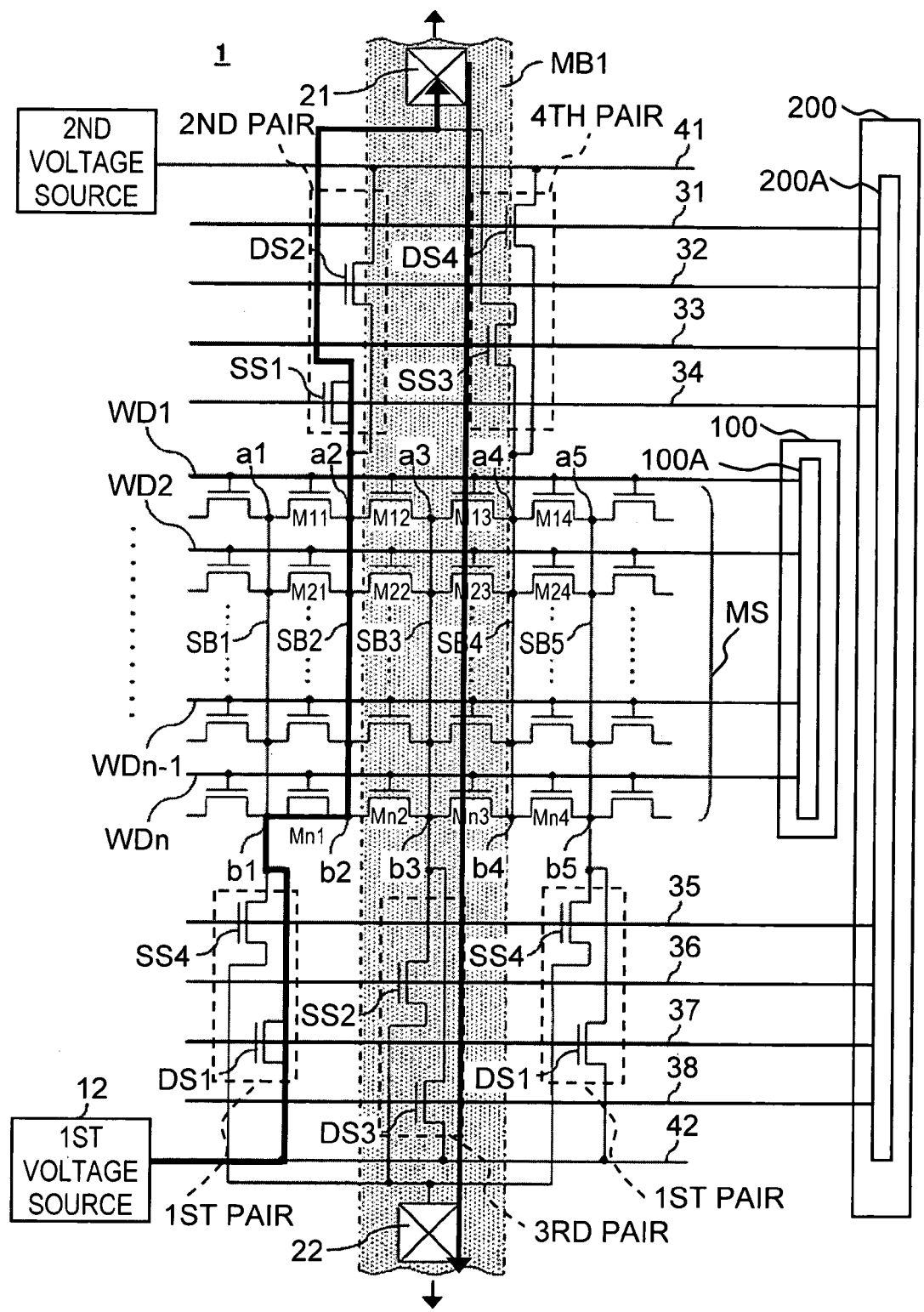
FIG. 3 shows a route of electric current in the memory cell array shown in FIG. 1 when a another memory cell is selected.

FIG. 3 shows another route of electric current in the memory cell array 1 shown in FIG. 1 when the memory cell Mn1 is selected by selecting the word line WDn under the selection of the selection pattern 1A same as the situation shown in FIG. 2. The route of the electric current is illustrated with a bold arrow, and the direction of the current flow is indicated by the bold arrow, as well as the FIG. 2.

In FIG. 3, since the memory cell readout circuit 200 selects the drain selector DS1, the electric current flows from its drain to its source in the drain selector DS1. As a result, the electric current flows from the first constant-voltage source 12 to the sub bit line SB1. Since the word line selecting circuit 100 selects the word line WDn, the electric current flows in the memory cell Mn1 whose gate is connected to the word line WDn, from its drain to its source. On the other hand, since the memory cell readout circuit 200 also selects the source selector SS1, the electric current flows from its drain to its source in the source selector SS1. As a result, the electric current flows from the source of the memory cell Mn1 to the second via-hole 21. The electric current flows on the main bit line MB1 via the second via-hole 21. The sense amplifier is connected to the main bit line MB1 at its end so that the electric current on the main bit line MB1 in the direction from the second via-hole 21 and to the first via-hole 22 (in the direction toward the location where the sense amplifier is disposed). The information stored in the memory cell Mn1 is provided to the sense amplifier by the memory cell readout circuit 200 through the electric current route.

As it is clear from FIGS. 2 and 3, according to the semiconductor memory of the preferred embodiment, there is no big difference in the length of the route of the electric current, which flows in the memory cell array 1 even in case that the selected memory cell (the selected word line) is different. Thus, the resistance value of the bit line does not depend on the location where the selected memory cell is located. In other words, the resistance value of the bit line is almost the same even if which memory cell is selected. As a result, the variation of the electric current value at the end of the bit lines to which a sense amplifier is connected can be suppressed. The reason why there is no big difference in the length of the route of the electric current, which flows in the memory cell array 1 even in case that the selected memory cell (the selected word line) is different is that each of the pairs, each of which includes a certain source selector and a certain drain selector and is connected to one of the sub bit lines adjacent to each other, is located at one of the sides sandwiching the word lines WD1~WDn. Further, this is also because the memory cell readout circuit 200 selects one of the drain selectors located at one side of the word lines WD1~WDn and one of the source selectors located at the other side of the word lines WD1~WDn, simultaneously. According to the arrangement described above, the electric current flows from the one end to the other end on a certain sub-bit line regardless the location of the memory cell being selected so that there is no big difference in the length of the route of the electric current, which flows in the memory cell array 1.

It is assumed that both of two pairs each having the source and the drain selectors, which are connected to the sub bit lines adjacent to each other, are located at the same side against the word lines WD1~WDn, and that the memory cell readout circuit 200 selects one of the drain selectors and one of the source selectors, both of which are located at the same side against the word lines WD1~WD, simultaneously. In this case, the electric current flows on a certain sub bit line from its one end to the location where a selected memory cell is disposed. Then, the electric current flows on an adjacent sub bit line from the location, like a U-letter-turn. Thus, the length of the route of the electric current, which flows in the memory cell array 1, is different in case that the selected memory cell is different. Since the width of the sub bit line is narrower than that of the main bit line and the thickness of the sub bit line is thinner than that of the main bit line, the resistance value of the sub bit line would be relatively large. Thus, in order to suppress the variation of the electric current value, it is very effective to equate the length of the route of the electric current.

The variation of the electric current value would become a serious problem when the voltage on the main bit line MB1 is amplified by the sense amplifier. Namely, when the amplified voltage is transformed in the digital level, the incidence of the error in the digital level rises. However, according to the semiconductor memory of the preferred embodiment, since the variation of the electric current value being inputted to the sense amplifier can be suppressed, the incidence of the error in the digital level falls so that it is expected to boost yield at the production process of the memory cell array.

According to the preferred embodiment, the first constant-voltage source 12 provides the constant voltage to the drain of the memory cell M11 via the first power supply line 42. The main bit line MB1 is connected to the sub bit line SB2 via the source selector SS1 so that the electric potential applied to the main bit line MB1 is determined only by the electric potential at the source of the memory cell M11. Thus, it is not required to change the electric potential being applied to the main bit line MB1. As a result, it is possible to reduce the power and time for charging to and discharging from the main bit line MB1 and the sub bit line SB1, compared with a structure such that the electric potential applied to the main bit line MB1 is switched between the source potential and the drain potential of the memory cell M11. In any selection pattern in addition to the selection pattern 1A, the electric potential applied to the main bit line MB1 is determined only by the electric potential at the source of the memory cell being selected.

Further, since the electric current flows from the first constant-voltage source 12 to the drain of the memory cell M11, then to its source, and finally to the main bit line MB1, the source potential of the memory cell M11 becomes lower than its drain potential. Thus, it is possible to suppress the coupling capacity between the sub bit lines SB1 and SB2 to low.

Figure 4:
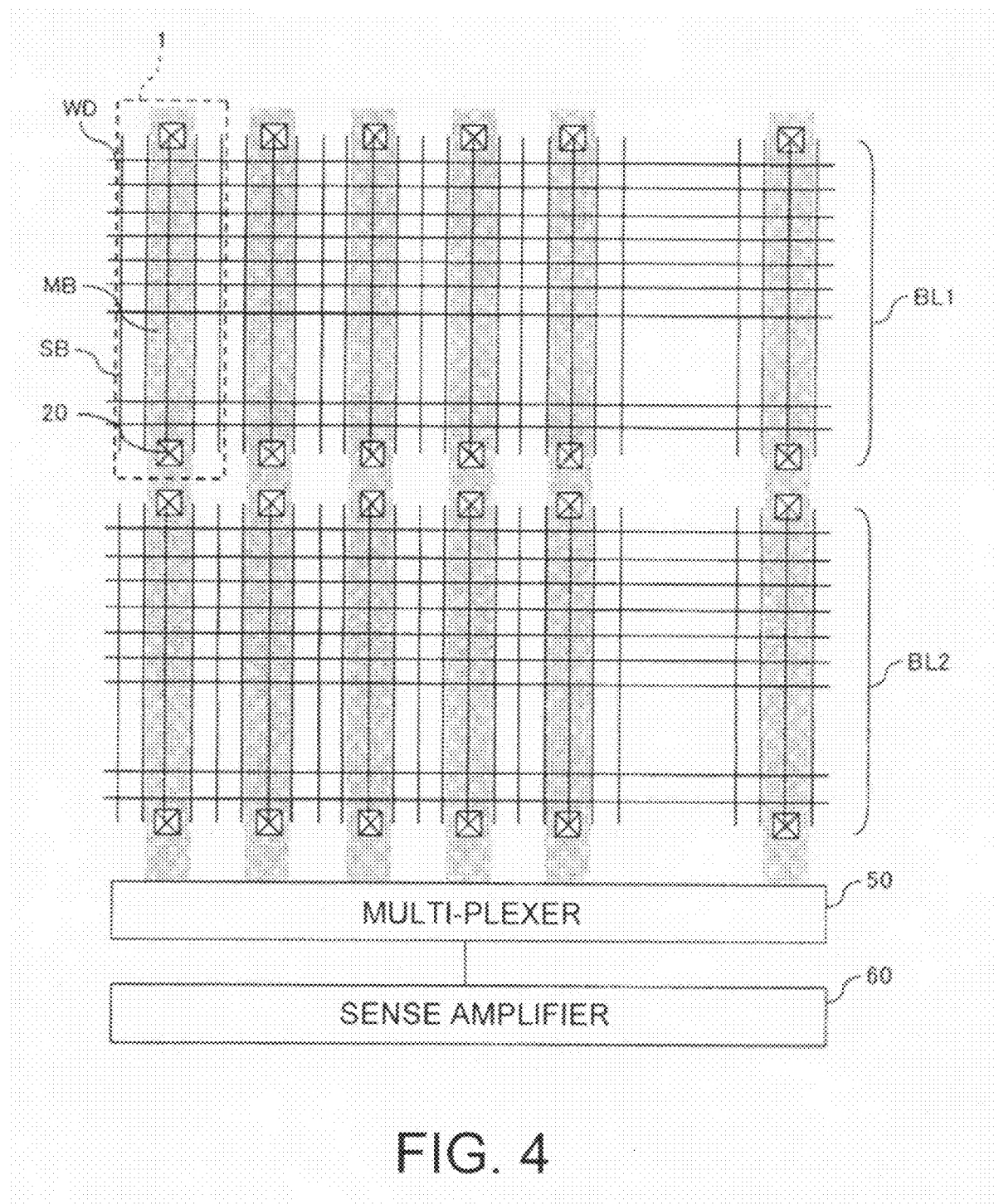
FIG. 4 is a circuit diagram of a semiconductor memory, according to a preferred embodiment.

Moreover, as shown in FIG. 4, other main bit lines are disposed in parallel to main bit line MB1. As well as the main bit line MB1, the electric potential of each of the other main bit lines is also determined by the source potential of the memory cell being selected. For this reason, it is also possible to suppress the coupling capacity between the main bit lines adjacent to each other to low so that it is possible to reduce the time for charging to and discharging from the main bit lines. The width of the main bit line is wider than that of the sub bit line and the thickness of the main bit line is thicker than that of the sub bit line, the capacity being parasitic on the main bit line would be relatively large. Thus, in order to reduce the power and time for charging to or discharging from the main bit lines, it is very effective to set the electric potential of the main bit line to the source potential of the memory cell being selected only.

As described above, according to the semiconductor memory of the preferred embodiment, it is possible to suppresses the variation of the electric current value at the location the bit lines end, not depending on the location of the memory cell being accessed, while the power consumption for and the time required for the charge or the discharge are suppressed to low and short.

As shown in FIG. 4, the semiconductor memory includes a plurality of the memory cell arrays 1 illustrated in FIG. 1, each of which is connected to a multiplexer 50 and a sense amplifier 60. A plurality of the memory cell arrays 1 are divided into two blocks BL1 and BL2. In each block, the word lines WD are used in common. In FIG. 2, although a plurality of the memory cell arrays 1 are divided into two blocks, the actual semiconductor memory includes a plurality of blocks, which are more than two. While the word lines are commonly used in the same block, each sub bit line SB is not commonly used over the block. In other words, one of the sub bit lines of the memory cell array 1 at the left end in the blocks BL1 is not connected to any of the sub bit lines of the memory cell array at the left end in the blocks BL2. The sub bit lines SB is connected to the main bit line MB via the via-hole 20. Each of the main bit lines, which are commonly used between the blocks BL1 and BL2, is connected to the sense amplifier 60 via the multiplexer 50. The multiplexer 50 selects one of the electric currents, which are inputted from the main bit lines, and the sense amplifier 60 amplifies the electric current inputted from the main bit lines. According to the preferred embodiment described above, since there is no big difference in the length of the route of the electric current, which flows on the sub bit line, even in case that the selected memory cell is different, it is possible to suppresses the variation of the electric current value being transmitted to the sense amplifier 60.

In the preferred embodiment, although the operation of the memory cell array is explained when the memory cell readout circuit 200 selects the drain selector DS1 and the source selector SS1 by selecting the selection pattern 1A, the same benefit can be expected when the memory cell readout circuit 200 selects another drain selector and another source selector by selecting another selection pattern.

In the preferred embodiment, although the five sub bit lines are used, there is no restriction as to the numbers of the sub bit lines for applying the concept of this invention. Further, there is no restriction as to the numbers of the memory cells for applying the concept of this invention. Moreover, in the preferred embodiment, although the drain selectors DS1~DS4 and the source selector SS1~SS4 are used, there is no restriction as to the numbers of the source and drain selectors for applying the concept of this invention. Thus the numbers of the source and drain selectors can be increased or decreased, corresponding to the number of the memory cells.

While the invention has been described with reference to illustrative embodiments, this description is not intended to be construed in a limiting sense. Thus, shapes, size and physical relationship of each component are roughly illustrated so the scope of the invention should not be construed to be limited to them. Further, to clarify the components of the invention, hatching is partially omitted in the cross-sectional views. Moreover, the numerical description in the embodiment described above is one of the preferred examples in the preferred embodiment so that the scope of the invention should not be construed to limit to them.

Various other modifications of the illustrated embodiment will be apparent to those skilled in the art on reference to this description. Therefore, the appended claims are intended to cover any such modifications or embodiments as fall within the true scope of the invention.

What I claim is:

1. A memory cell array, comprising:
    a plurality of memory cells disposed in columns and in rows, each memory cell including a transistor having a gate, a source and a drain;
    a plurality of word lines extending in the row direction, wherein the gates of transistors in the memory cells disposed in each row are commonly connected to one of the word lines;
    a plurality of sub bit lines extending in the column direction, wherein the sources of the transistors in the memory cells disposed in a first column and the drains of the transistors in the memory cells disposed in a second column, which is adjacent to the first column, are commonly connected to one of the sub bit lines;
    a main bit line; and
    a plurality of transistor pairs each having a source selector and a drain selector,
    wherein the word lines are sandwiched between the transistor pairs, and wherein one of the transistors in each transistor pair has a terminal that is directly connected to the main bit line.

2. A memory cell array as claimed in claim 1,
wherein the main bit line is selectively connected to one of the sub bit lines via one of the source selectors; and
wherein a power supply line is selectively connected to said one of the sub bit lines, which is electrically connected to the main bit line, via one of the drain selectors.

3. A semiconductor memory, comprising:
a memory cell array including,
- (i) a plurality of memory cells disposed in columns and in rows, each memory cell includes a transistor having a gate, a source and a drain,
- (ii) a plurality of word lines extending in the row direction, wherein the gates of transistors in the memory cells disposed in each row are commonly connected to one of the word lines,
- (iii) a plurality of sub bit lines extending in the column direction, wherein the sources of the transistors in the memory cells disposed in a first column and the drains of the transistors in the memory cells disposed in a second column, which is adjacent to the first column, are commonly connected to one of the sub bit lines,
- (iv) a plurality of transistor pairs each having a source selector and a drain selector, wherein each transistor pair is connected to one of the sub bit lines at end, and
- (v) a main bit line electrically connected to one of the sub bit lines via a one of the source selectors;

a main bit line;
a first circuit selecting one of the word lines; and
a second circuit reading out information stored in one of memory cells, which is connected to the word line selected by the first circuit, by selecting one of the drain selectors and one of the source selectors, simultaneously,
wherein the word lines are sandwiched between the transistor pairs, and
wherein one of the transistors in each transistor pair has a terminal that is directly connected to the main bit line.

4. A semiconductor memory as claimed in claim 3, further comprising:
a power supply line that is selectively connected to the one of the sub bit lines, which is electrically connected to the main bit line, via one of the drain selectors.

5. A memory cell array as claimed in claim 1, wherein the transistor pairs are divided into a first group of transistor pairs and a second group of transistor pairs, each group having a plurality of transistor pairs, and wherein one of the transistors of each transistor pair in the first group has a terminal that is connected to a first power supply line and one of the transistors of each transistor pair in the second group has a terminal that is connected to a second power supply line.

6. A semiconductor memory as claimed in claim 3, wherein the transistor pairs are divided into a first group of transistor pairs and a second group of transistor pairs, each group having a plurality of transistor pairs, and wherein one of the transistors of each transistor pair in the first group has a terminal that is connected to a first power supply line and one of the transistors of each transistor pair in the second group has a terminal that is connected to a second power supply line.

7. A semiconductor memory, comprising:
an array of memory cells disposed in rows and columns, each memory cell including a transistor having a source, a gate, and a drain, the columns of the array including a first column, a second column, and a third column;
a plurality of word lines, each word line being connected to the gates of the transistors in a corresponding one of the rows;
a first sub bit line connected to the sources of the transistors in the first column and the drains of the transistors in the second column;
a second sub bit line connected to the sources of the transistors in the second column and the drains of the transistors in the third column;
a main bit line;
a first transistor pair that selectively couples the first sub bit line to either a first voltage source or the main bit line; and
a second transistors pair that selectively couples the second sub bit line to either a second voltage source or the main bit line, wherein the word lines are sandwiched between the transistor pairs and, wherein a terminal of a transistor in each of first and second transistor pairs is directly connected to the main bit line.

8. A semiconductor memory as claimed in claim 7, wherein the columns of the array additionally include a fourth column, and further comprising:
a third sub bit line connected to the sources of the transistors in the third column and the drains of the transistors in the fourth column; and
a third transistor pair that selectively couples the third sub bit line to either the first voltage source or the main bit line.

9. A semiconductor memory as claimed in claim 8, wherein a transistor of the first transistor pair and a transistor of the second transistor pair are actuated if a memory cell in the second column is selected.

\* \* \* \* \*